(12) United States Patent  
Fu et al.

(10) Patent No.: US 9,130,122 B2  
(45) Date of Patent: Sep. 8, 2015

(54) LIGHT EMITTING DIODE

(71) Applicants: Industrial Technology Research Institute, Hsinchu (TW); WALSIN LIHWA Corp, Taoyuan County (TW)

(72) Inventors: Yi-Keng Fu, Hsinchu County (TW); Chia-Lung Tsai, Kaohsiung (TW); Hung-Tse Chen, Hsinchu County (TW); Chih-Hsuen Chou, Taipei (TW)

(73) Assignees: Industrial Technology Research Institute, Hsinchu (TW); WALSIN LIHWA Corp, Taoyuan (TW)

( * ) Notice: Subject to any disclaimer, the term of this patent is extended or adjusted under 35 U.S.C. 154(b) by 0 days.

(21) Appl. No.: 14/181,738

(22) Filed: Feb. 17, 2014

(65) Prior Publication Data  
US 2015/0069321 A1 Mar. 12, 2015

(30) Foreign Application Priority Data  
Sep. 6, 2013 (TW) .............................. 102132271 A

(51) Int. Cl.  
*H01L 29/06* (2006.01)  
*H01L 27/15* (2006.01)  
(Continued)

(52) U.S. Cl.  
CPC ............ *H01L 33/325* (2013.01); *H01L 33/025* (2013.01); *H01L 33/22* (2013.01)

(58) Field of Classification Search  
CPC ........ B82Y 20/00; B82Y 10/00; H01L 33/06; H01L 33/0075; H01L 33/0079; H01L 33/32; H01L 33/54; H01L 33/62; H01L 27/15; H01L 21/8252; H01L 2924/01079; H01J 1/34; H01J 2201/3423

USPC .......... 438/22–27, 29, 37, 45–47; 257/11–14, 257/79, 80, 85  
See application file for complete search history.

(56) References Cited

U.S. PATENT DOCUMENTS 6,631,022 B1 10/2003 Kihira et al.  
6,677,617 B2 1/2004 Tominaga  
(Continued)

FOREIGN PATENT DOCUMENTS

CA 2599881 9/2007  
CN 100359704 1/2008  
(Continued)

OTHER PUBLICATIONS  
Chia-Feng Lin et al., "Blue light-emitting diodes with a roughened backside fabricated by wet etching," Applied Physics Letters, Nov. 16, 2009, pp. 1-3.  
(Continued)

*Primary Examiner* — Hsien Ming Lee  
(74) *Attorney, Agent, or Firm* — Jianq Chyun IP Office

(57) ABSTRACT

A light emitting diode (LED) including a first-type doped GaN substrate, a first-type doped semiconductor layer, an active layer, a second-type semiconductor layer, a first electrode, and a second electrode is provided. The first-type doped GaN substrate has a first doped element. The first-type semiconductor layer is disposed on the first-type doped GaN substrate. The first-type semiconductor layer has a second doped element different from the first doped element, and the doped concentration of the second doped element—may have a peak from $3E^{18}/cm^3$ to $1E^{20}/cm^3$ at an interface between the first-type doped GaN substrate and the first-type semiconductor layer. The active layer is disposed on the first-type semiconductor layer, and the second-type semiconductor layer is disposed on the active layer. The first electrode and the second electrode are respectively disposed on the first-type doped GaN substrate and the second-type semiconductor layer. Other LEDs are also provided.

19 Claims, 12 Drawing Sheets

(51) Int. Cl.
*H01L 21/00* (2006.01)
*H01L 33/32* (2010.01)
*H01L 33/02* (2010.01)
*H01L 33/22* (2010.01)

(56) References Cited

U.S. PATENT DOCUMENTS

| | | |
|---|---|---|
| 6,753,552 B1 | 6/2004 | Lan et al. |
| 6,773,504 B2 | 8/2004 | Motoki et al. |
| 6,815,730 B2 * | 11/2004 | Yamada .................. 257/101 |
| RE38,805 E | 10/2005 | Ohba et al. |
| 6,992,331 B2 | 1/2006 | Hon et al. |
| 7,186,580 B2 | 3/2007 | Tran et al. |
| 7,601,621 B2 | 10/2009 | Choi et al. |
| 7,687,376 B2 | 3/2010 | Choi et al. |
| 7,754,514 B2 | 7/2010 | Yajima et al. |
| 7,985,971 B2 | 7/2011 | Cai et al. |
| 8,120,013 B2 | 2/2012 | Takano et al. |
| 8,143,640 B2 | 3/2012 | Lee |
| 8,211,721 B2 | 7/2012 | Lin et al. |
| 2007/0217458 A1 * | 9/2007 | Kitano et al. ............ 372/43.01 |
| 2011/0254048 A1 | 10/2011 | Amano et al. |
| 2012/0104412 A1 | 5/2012 | Zhong et al. |
| 2013/0048942 A1 | 2/2013 | Konno et al. |

FOREIGN PATENT DOCUMENTS

| | | |
|---|---|---|
| CN | 100389503 | 5/2008 |
| CN | 100435360 | 11/2008 |
| CN | 100511731 | 7/2009 |
| CN | 101533846 | 9/2009 |
| CN | 101556983 | 10/2009 |
| CN | 101617415 | 12/2009 |
| CN | 101740677 | 6/2010 |
| CN | 101834239 | 9/2010 |
| CN | 101834240 | 9/2010 |
| CN | 101901756 | 12/2010 |
| CN | 101901760 | 12/2010 |
| CN | 102412351 | 4/2012 |
| CN | 102418146 | 4/2012 |
| CN | 102820394 | 12/2012 |
| EP | 0854473 | 9/2002 |
| EP | 0977278 | 9/2007 |
| JP | 08-213655 | 8/1996 |
| JP | 09-167857 | 6/1997 |
| JP | 10-261817 | 9/1998 |
| JP | 2000-091633 | 3/2000 |
| JP | 2000-091640 | 3/2000 |
| JP | 2000-223743 | 8/2000 |
| JP | 2002-057370 | 2/2002 |
| JP | 2002-100807 | 4/2002 |
| JP | 2002-118283 | 4/2002 |
| JP | 2002-118284 | 4/2002 |
| JP | 2002-118285 | 4/2002 |
| JP | 2002-118286 | 4/2002 |
| JP | 2002-118287 | 4/2002 |
| JP | 2002-356398 | 12/2002 |
| JP | 2004-096122 | 3/2004 |
| JP | 2005-019874 | 1/2005 |
| JP | 2008-098568 | 4/2008 |
| JP | 2009-105435 | 5/2009 |
| TW | 200408140 | 5/2004 |
| TW | 200633262 | 9/2006 |
| TW | I373858 | 10/2012 |

OTHER PUBLICATIONS

N. Koide et al., "Doping of GaN with Si and properties of blue m/i/n/n+ GaN LED with Si-doped n+ -layer by MOVPE," Journal of Crystal Growth, vol. 115, Issue 1, Dec. 1991, pp. 639-642.

S. Saravanan et al., "Si doped p- and n-type $Al_x Ga_{1-x}$ As epilayers for high density lateral-junction LED arrays on (311) A patterned substrate," Solid-State Electronics, Mar. 15, 2004, pp. 1-6.

Hong-Su Lin, "Optical Properties of UV-LED with Si doped Quaternary Barriers," Master's Thesis, Jun. 2002, Electrical Engineering Department of National Central University.

Chia-Feng Lin et al., "Fabrication of the InGaN-Based Light-Emitting Diodes Through a Photoelectrochemical Process," IEEE Photonics Technology Letters, Vol. 21, No. 16, Aug. 15, 2009, pp. 1-3.

Hock M. Ng. et al., "GaN nanotip pyramids formed by anisotropic etching," Journal of Applied Physics, vol. 94, No. 1, July 1, 2003, pp. 1-4.

Yi-Keng Fu et al., "Optical Simulation and Fabrication of Near-Ultraviolet LEDs on a Roughened Backside GaN Substrate," IEEE Photonics Technology Letters, Vol. 24, No. 6, Mar. 15, 2014, pp. 1-3.

C. W. Kuo et al., "Optical Simulation and Fabrication of Nitride-Based LEDs With the Inverted Pyramid Sidewalls," IEEE Journal of Selected Topics in Quantum Electronics, Jan. 20, 2009, pp. 1-5.

Yi-Keng Fu et al., "Study of InGaN-Based Light-Emitting Diodes on a Roughened Backside GaN Substrate by Chemical Wet-Etching Process," IEEE Photonics Technology Letters, Vol. 23, No. 19, Oct. 1, 2011, pp. 1-3.

G. Pozina et al., Abstract of "Effect of silicon and oxygen doping on donor bound excitons in bulk GaN," Physical Review B, vol. 84, Issue 16, Oct. 27, 2011, pp. 1.

* cited by examiner

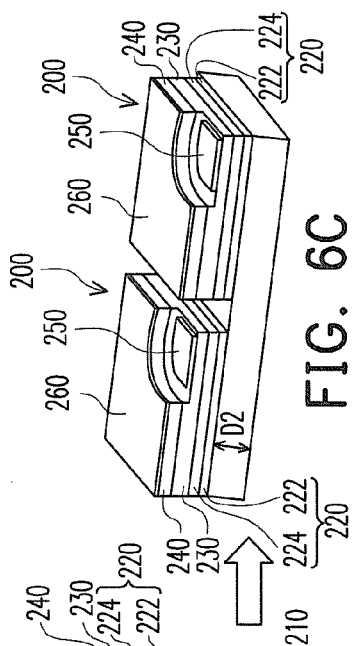
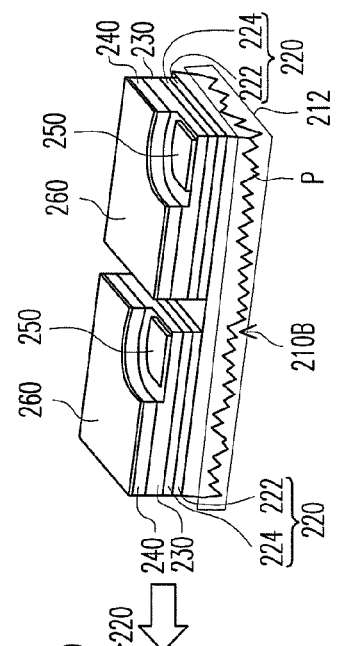
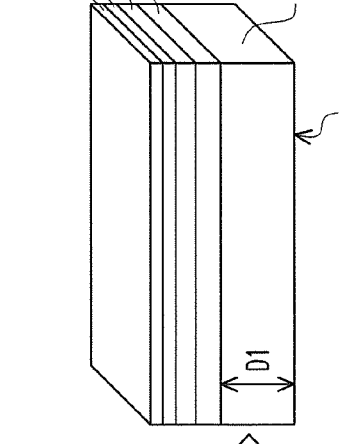
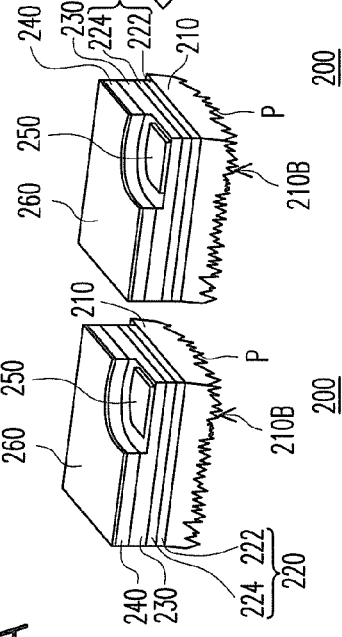
FIG. 6A
FIG. 6B
FIG. 6C
FIG. 6D
FIG. 6E

LIGHT EMITTING DIODE

CROSS-REFERENCE TO RELATED APPLICATION

This application claims the priority benefit of Taiwan application serial no. 102132271, filed on Sep. 6, 2013. The entirety of the above-mentioned patent application is hereby incorporated by reference herein and made a part of this specification.

TECHNICAL FIELD

The disclosure relates to a light emitting diode (LED) capable of enhancing luminous efficiency.

BACKGROUND

A light emitting diode (LED) is a semiconductor device constituted mainly by group III-V compound semiconductor materials, for instance. Such semiconductor materials have a characteristic of converting electricity into light. Hence, when a current is applied to the semiconductor materials, electrons therein are combined with holes, and excessive energy is released in form of light, thereby achieving an effect of luminosity.

A sapphire substrate is often used as in a blue-green LED which dominates the market of liquid crystal displays and lighting tools, and an active layer of such LED is made of Gan/InGaN materials epitaxially grown on the sapphire substrate. Due to the mismatched lattice constant of the epitaxially grown GaN/InGaN film and the sapphire substrate, the resultant heteroepitaxy frequently leads to high defect density (approximately $10^9$ cm$^{-2}$ to $10^{10}$ cm$^{-2}$) in the nitride film; in addition, insufficient thermal conductivity (0.3 W/cmK) often results in the significant difference in thermal expansion coefficients. As a result, the residual stress often causes distortion or cracks of chips, thus posing a negative impact on the LED with high luminous efficiency.

Moreover, because of the difference between the indices of refraction of GaN and air, merely 4.54% of light generated in the LED can be successfully emitted from the GaN surface to the air. Therefore, the low light extraction efficiency causes drastic reduction in the external quantum efficiency of the LED, and accordingly the industry is earnestly pursuing an LED with high light extraction efficiency.

SUMMARY

In an embodiment of the disclosure, a light emitting diode (LED) grown on a surface of a homoepitaxial n-type doped GaN film is provided. The homoepitaxial growth significantly reduces the defect density, and the n-type nitride semiconductor is composed of two different dopants (silicon and oxide). At an interface of the silicon doped and oxide doped n-type nitride semiconductor, the issue of the reduced concentration at the interface may be effectively resolved as long as a specific condition can be satisfied, and thereby the performance of the LED may be improved.

In an exemplary embodiment of the disclosure, a method of manufacturing an LED device is provided. In the method, a geometric structure is formed on an N-face of a GaN film by applying a wet-etch technique, and the light extraction efficiency may be effectively enhanced to a certain degree in a specific wavelength range. The density of the geometric structure is greater than or equal to the defect density of the manufactured film, and the thickness of the LED is from 70 μm to 200 μm.

According to an exemplary embodiment of the disclosure, an LED that includes a first-type doped GaN substrate, a first-type semiconductor layer, an active layer, a second-type semiconductor layer, a first electrode, and a second electrode is provided. The first-type doped GaN substrate has a first doped element. The first-type semiconductor layer is disposed on the first-type doped GaN substrate, and the first-type semiconductor layer has a second doped element different from the first doped element. The doped concentration of the second doped element has a peak from $3\times10^{18}$/cm$^3$ to $1\times10^{20}$/cm$^3$ at an interface between the first-type doped GaN substrate and the first-type semiconductor layer. The active layer is disposed on the first-type semiconductor layer, and the second-type semiconductor layer is disposed on the active layer. The first electrode and the second electrode are respectively disposed on the first-type doped GaN substrate and the second-type semiconductor layer.

According to another exemplary embodiment of the disclosure, an LED that includes a first-type doped GaN substrate, a first-type semiconductor layer, an active layer, a second-type semiconductor layer, a first electrode, and a second electrode is provided. The first-type doped GaN substrate has a first doped element. The first-type semiconductor layer is disposed on the first-type doped GaN substrate, and the first-type semiconductor layer has a second doped element different from the first doped element. A ratio of a doped concentration of the second doped element to a doped concentration of the first doped element is 0.38 to 1000 at an interface between the first-type doped GaN substrate and the first-type semiconductor layer. The active layer is located on the first-type semiconductor layer. The second-type semiconductor layer is located on the active layer. The first electrode and the second electrode are respectively located on the first-type doped GaN substrate and the second-type semiconductor layer.

According to yet another exemplary embodiment of the disclosure, an LED that includes a first-type doped GaN substrate, a first-type semiconductor layer, an active layer, a second-type semiconductor layer, a first electrode, and a second electrode is provided. The first-type doped GaN substrate has a first doped element, and the first-type semiconductor layer is disposed on the first-type doped GaN substrate and has a second doped element different from the first doped element. At an interface between the first-type doped GaN substrate and the first-type semiconductor layer, a quotient ($\Delta C/\Delta t$) of a doped concentration variation value ($\Delta C$) of the second doped element with respect to a thickness ($\Delta t$) of the interface from $1.0\times10^{22}$/cm$^4$ to $1.0\times10^{26}$/cm$^4$. The active layer is located on the first-type semiconductor layer. The second-type semiconductor layer is located on the active layer. The first electrode and the second electrode are respectively located on the first-type doped GaN substrate and the second-type semiconductor layer.

In view of the above, the first-type semiconductor layer is homoepitaxially grown on the GaN substrate by having the doped concentration of the doped element in the first-type semiconductor layer satisfy certain conditions, by having the concentration variation of doped element in the first-type semiconductor with respect to the thickness satisfy certain conditions, or by having a quotient of the doped concentration variation value of the doped element in the first-type semiconductor layer satisfy certain conditions. By employing any of the aforesaid techniques, the issue of the reduced concentration at the interface may be effectively resolved, and the performance of the LED may be enhanced.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 1A and FIG. 1B are schematic cross-sectional diagrams respectively illustrating an LED according to an exemplary embodiment, wherein FIG. 1A illustrates the LED with a horizontal structure, and FIG. 1B illustrates the LED with a vertical structure.

FIG. 6A through FIG. 6E are schematic cross-sectional diagrams illustrating a fabricating process of an LED according to an exemplary embodiment.

DESCRIPTION OF THE EMBODIMENTS

Figure 1A:
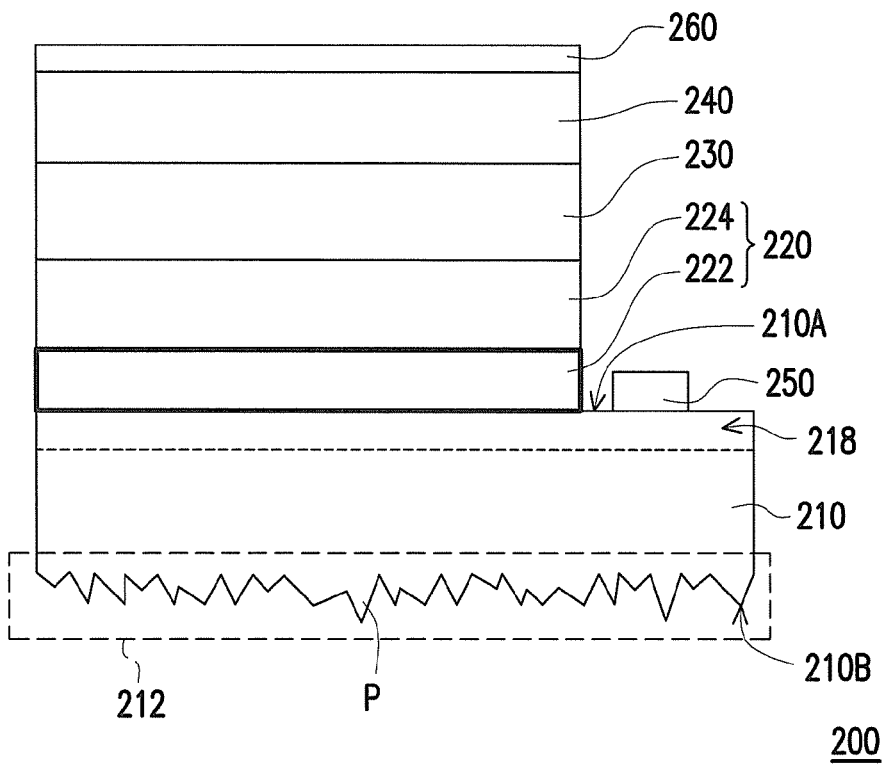

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1B:
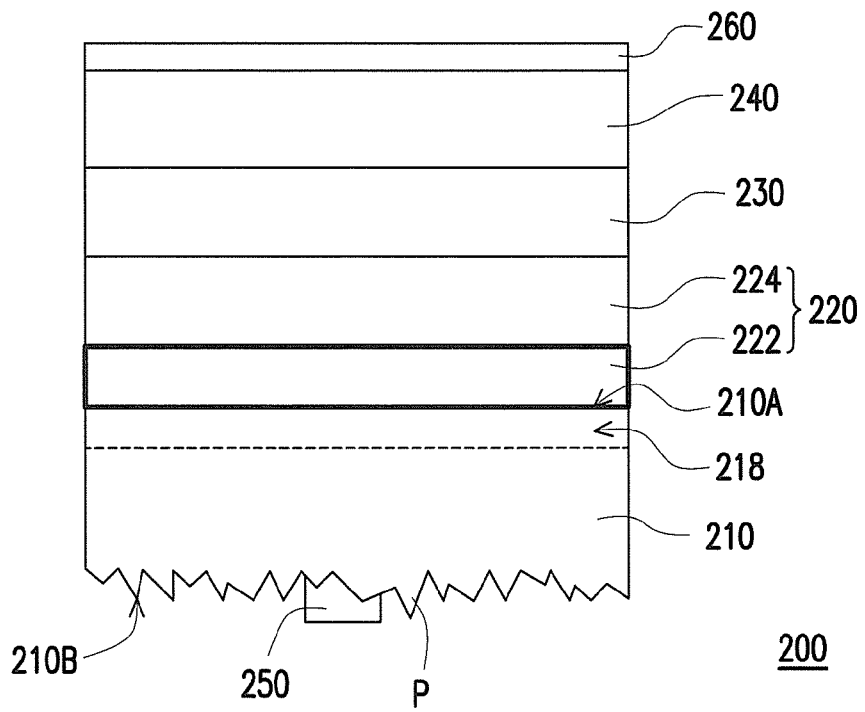

FIG. 1A and FIG. 1B are schematic cross-sectional diagram respectively illustrating an LED according to an exemplary embodiment. FIG. 1A is an LED with a horizontal structure having horizontal electrodes. FIG. 1B is an LED with a vertical structure having vertical electrodes.

With reference to FIG. 1A and FIG. 1B, the LED 200 includes a first-type doped GaN substrate 210, a first-type semiconductor layer 220, an active layer 230, a second-type semiconductor layer 240, a first electrode 250, and a second electrode 260. The first-type doped GaN substrate 210 is, for instance, a nitride semiconductor mold including a thick GaN layer or another mold including a thick GaN layer. The first-type semiconductor layer 220 is disposed on the first-type doped GaN substrate 210. The active layer 230 is disposed between the first-type semiconductor layer 220 and the second-type semiconductor layer 240. The first electrode 250 and the second electrode 260 are respectively disposed on the first-type doped GaN substrate 210 and the second-type semiconductor layer 240.

The first type is an N type, and the second type is a P type, for instance; it is also likely for the first-type dopant to be the p-type dopant and the second-type dopant to be the n-type dopant, which should not be construed as a limitation to the disclosure. Besides, the first-type doped GaN substrate 210 has a first doped element, and the first-type semiconductor layer 220 has a second doped element different from the first doped element. Specifically, in the present exemplary embodiment, the first doped element is an oxide doped element, and the second doped element is a silicon doped element. Although the second doped element of the first-type semiconductor layer 220 is different from the first doped element of the first-type doped GaN substrate 210, the first-type doped GaN substrate 210 and the first-type semiconductor layer 220 are both n-type homoepitaxial layers. In particular, the n-type semiconductor layer may be grown on the surface of the n-type doped GaN substrate, for instance. Compared to heteroepitaxy, homoepitaxy allows the defect density of the semiconductor layer to be reduced significantly.

According to the present exemplary embodiment, the first-type doped GaN substrate 210 (hereinafter referred to as the n-type doped GaN substrate 210) has a first surface 210A and a second surface 210B respectively located at two opposite sides of the n-type doped GaN substrate 210. Here, the second surface 210B is the N-face of the n-type doped GaN substrate 210 having the oxide doped element, for instance, and the first-type semiconductor layer 220 (hereinafter referred to as the n-type semiconductor layer 220) is located on the first surface 210A of the n-type doped GaN substrate 210 having the oxide doped element. It should be mentioned that the first-type semiconductor layer 220 includes an interface layer of silicon-doped concentration and a silicon doped semiconductor layer 224, which will be elaborated hereinafter.

Moreover, as shown in FIG. 1A and FIG. 1B, the thickness of the LED 200 (excluding the first and second electrodes 250 and 260) in the embodiment is from 70 μm to 200 μm, and the second surface 210B of the n-typed doped GaN substrate 210 is a rough surface constituted by a plurality of protuberances P (similar to a geometric structure). Accordingly, in addition to the reduction of the light absorption rate as light passes through the N-type doped GaN substrate 210, the total internal reflection effect generated at the second surface 210B can also be lowered when light passes through the n-type doped GaN substrate 210 due to the design of the protuberances P, thereby enhancing the light output power of the LED 200. Since the second surface 210B of the n-type doped GaN substrate 210 has the geometric structure, the protuberances P formed thereon may, if satisfying certain conditions, increase the light extraction efficiency. For instance, the light extraction efficiency may be significantly improved if the distribution density of the protuberances P on the second surface 210B is greater than the intrinsic defect density of the n-type doped GaN substrate 210.

The n-type semiconductor layer 220 described in the present exemplary embodiment may have a single-layer structure or may has stacked layers including n-type semiconductor layers 220 with different thicknesses or with different doped concentrations, and so may the p-type semiconductor layer 240. In FIG. 1A and FIG. 1B, the n-type semiconductor layer 220 and the p-type semiconductor layer 240 merely have the one-single layer structure, respectively.

Figure 2A:
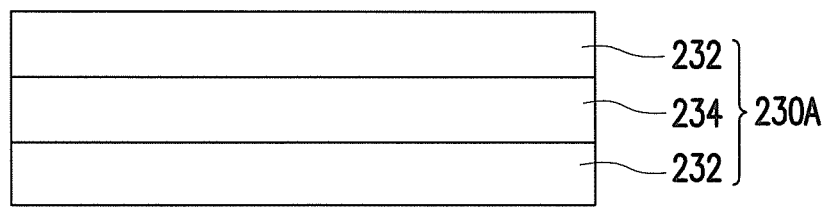
FIG. 2A is a schematic cross-sectional diagram illustrating an active layer having a single quantum well structure in an LED according to an exemplary embodiment.
Figure 2B:
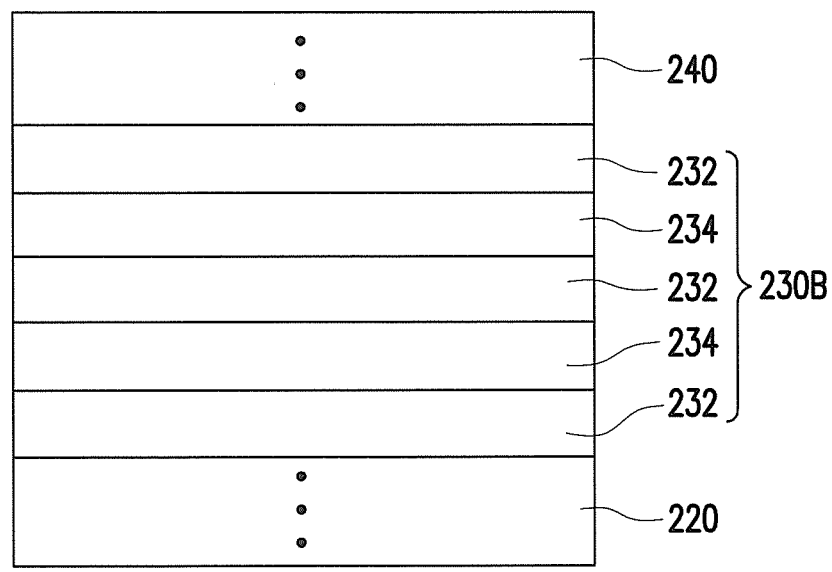
FIG. 2B is a schematic cross-sectional diagram illustrating an active layer having a multi-quantum well structure in an LED according to an exemplary embodiment.

The active layer 230, as shown in FIG. 2A and FIG. 2B, may be composed of a single quantum well (i.e., a single quantum well active layer 230A) or multiple quantum wells (i.e., a multi-quantum well active layer 230B). FIG. 2A is a schematic cross-sectional diagram illustrating an active layer having a single quantum well structure in an LED according to an exemplary embodiment. FIG. 2B is a schematic cross-sectional diagram illustrating an active layer having a multi-quantum well structure in an LED according to an exemplary embodiment. For instance, as shown in FIG. 2A, the single quantum well active layer 230A may be formed by two quantum barrier layers 232 and a quantum well 234 sandwiched between the two quantum barrier layers 232, thus constituting a quantum barrier layer 232/quantum well 234/quantum barrier layer 232 structure. In an exemplary blue LED 200, a material of the quantum well 234 is $Al_xIn_yGa_{1-x-y}N$, wherein $0 \leq x \leq 1$ and $0 \leq y \leq 1$. According to the actual requirements, those skilled in the art may select the concentrations of x and y for growth, although the disclosure is not limited thereto. As shown in FIG. 2B, the active layer 230 may be composed of multiple quantum wells (i.e., the multi-quantum well active layer 230B). The multi-quantum well active layer 230B may be formed by at least two pairs of stacked quantum barrier layers 232 and quantum wells 234. For instance, in FIG. 2B, the multi-quantum well active layer 230B is composed of three pairs of stacked quantum barrier layers 232/quantum wells 234.

During the homoepitaxial growth with different doped elements on the N-face of the n-type doped GaN substrate 210, following issues may arise at the interface between the n-type semiconductor layer 220 and the n-type doped GaN substrate 210. Oxygen atoms are diffused from the N-face of the n-type doped GaN substrate 210; due to the diffused oxygen atoms, the effects of the n-type conductive layer generated by replacing gallium atoms with silicon atoms (resulting from the silicon dopant) are blocked. Therefore, the doped concentration of the silicon doped element is low at the interface between the n-type semiconductor layer 220 and the n-type doped GaN substrate 210. As long as electrons are injected into the LED 200, the electrons are blocked by the interface having the GaN with high resistance; as a result, the series resistance of the entire device is increased, and the forward voltage of the LED 200 is raised.

In the LED 200 described herein, a silicon doped concentration processing step is performed on the interface (e.g., the interface layer of silicon-doped concentration 222 shown in FIG. 1A and FIG. 1B) between the n-type semiconductor layer 220 and the n-type doped GaN substrate 210. For instance, a high-concentration silicon doping process is performed on the interface between the n-type semiconductor layer 220 and the n-type doped GaN substrate 210, such that the doped concentration of the silicon doped element at the interface is higher than the predetermined doped concentration of the silicon doped element at other regions of the n-type semiconductor layer 220. On any, two, or all of the following conditions, i.e., the doped concentration of the silicon doped element in the n-type semiconductor layer 220 at the interface satisfies certain conditions, a ratio of the doped concentration of the doped element in the n-type semiconductor layer 220 to the doped concentration of the doped element in the n-type doped GaN substrate 210 at the interface satisfies certain conditions, or a quotient ($\Delta C/\Delta t$) of the doped concentration variation value ($\Delta C$) of the doped element in the n-type semiconductor layer 220 at the interface with respect to the thickness ($\Delta t$) of the interface satisfies certain conditions, the issue of the reduced concentration at the interface may be effectively resolved.

Particularly, according to an exemplary embodiment of the disclosure, in order for the doped concentration of the silicon doped element in the n-type semiconductor layer 220 at the interface to satisfy certain conditions, an oxide doped semiconductor layer 218 with the fixed oxide doped concentration is formed on the first surface 210A of the n-type doped GaN substrate 210, and the n-type semiconductor layer 220 is formed on the oxide doped semiconductor layer 218. During the process of forming the n-type semiconductor layer 220 on the oxide doped semiconductor layer 218, an interface layer of silicon-doped concentration 222 is grown at the interface between the n-type semiconductor layer 220 and the n-type doped GaN substrate 210, and a silicon doped semiconductor layer 224 is grown on the interface layer of silicon-doped concentration 222. Since the doped concentration of the silicon doped element in the interface layer of silicon-doped concentration 222 has a peak from $3 \times 10^{18}/cm^3$ to $1 \times 10^{20}/cm^3$, oxygen atoms (in the GaN film with the oxide doped element on the first surface 210A of the n-type doped GaN substrate 210) diffused during a high-temperature epitaxial growth process may be compensated, so as to successfully resolve the issue of the raised forward voltage caused by the low doped concentration of the silicon doped element at the interface. The detailed effects will be elaborated hereinafter.

Besides, according to an exemplary embodiment of the disclosure, in order for the ratio of the doped concentration of the doped element in the n-type semiconductor layer 220 to the doped concentration of the doped element in the n-type doped GaN substrate 210 at the interface to satisfy certain conditions, during the process of forming the n-type doped GaN substrate 210 and the n-type semiconductor layer 220, the ratio of the peak doped concentration of the silicon doped element in the interface layer of silicon-doped concentration 222 to the fixed doped concentration of the oxide doped element in the oxide doped semiconductor layer 218 is set to be 0.38 to 1000, preferably from 0.38 to 200 and more preferably from 0.6 to 100, so as to compensate the oxygen atoms (in the GaN film with the oxide doped element on the first surface 210A of the n-type doped GaN substrate 210) diffused during the high-temperature epitaxial growth process. Thereby, the issue of the raised forward voltage caused by the low doped concentration of the silicon doped element at the interface may be successfully resolved. The detailed effects will be elaborated hereinafter.

Moreover, according to an exemplary embodiment of the disclosure, in order for the quotient ($\Delta C/\Delta t$) of the doped concentration variation value ($\Delta C$) of the doped element in the n-type semiconductor layer 220 at the interface with respect to the thickness ($\Delta t$) of the interface to satisfy certain conditions, during the process of forming the n-type doped GaN substrate 210 and the n-type semiconductor layer 220, the quotient ($\Delta C/\Delta t$) of the doped concentration variation value ($\Delta C$) of the silicon doped element in the interface layer of silicon-doped concentration 222 with respect to the thickness ($\Delta t$) of the interface is set to be from $1.0 \times 10^{22}/cm^4$ to $1.0 \times 10^{26}/cm^4$, preferably from $3.75 \times 10^{22}/cm^4$ to $5.0 \times 10^{25}/cm^4$ and more preferably from $1.5 \times 10^{23}/cm^4$ to $2.0 \times 10^{25}/cm^4$, so as to compensate the oxygen atoms (in the GaN film with the oxide doped element on the second surface 210B of the n-type doped GaN substrate 210) diffused during the high-temperature epitaxial growth process. Thereby, the issue of the raised forward voltage caused by the low doped concentration of the silicon doped element at the interface may be successfully resolved. The detailed effects will be elaborated hereinafter.

The effects achieved by the LED are explained below with reference to experimental results.

Figure 3A:
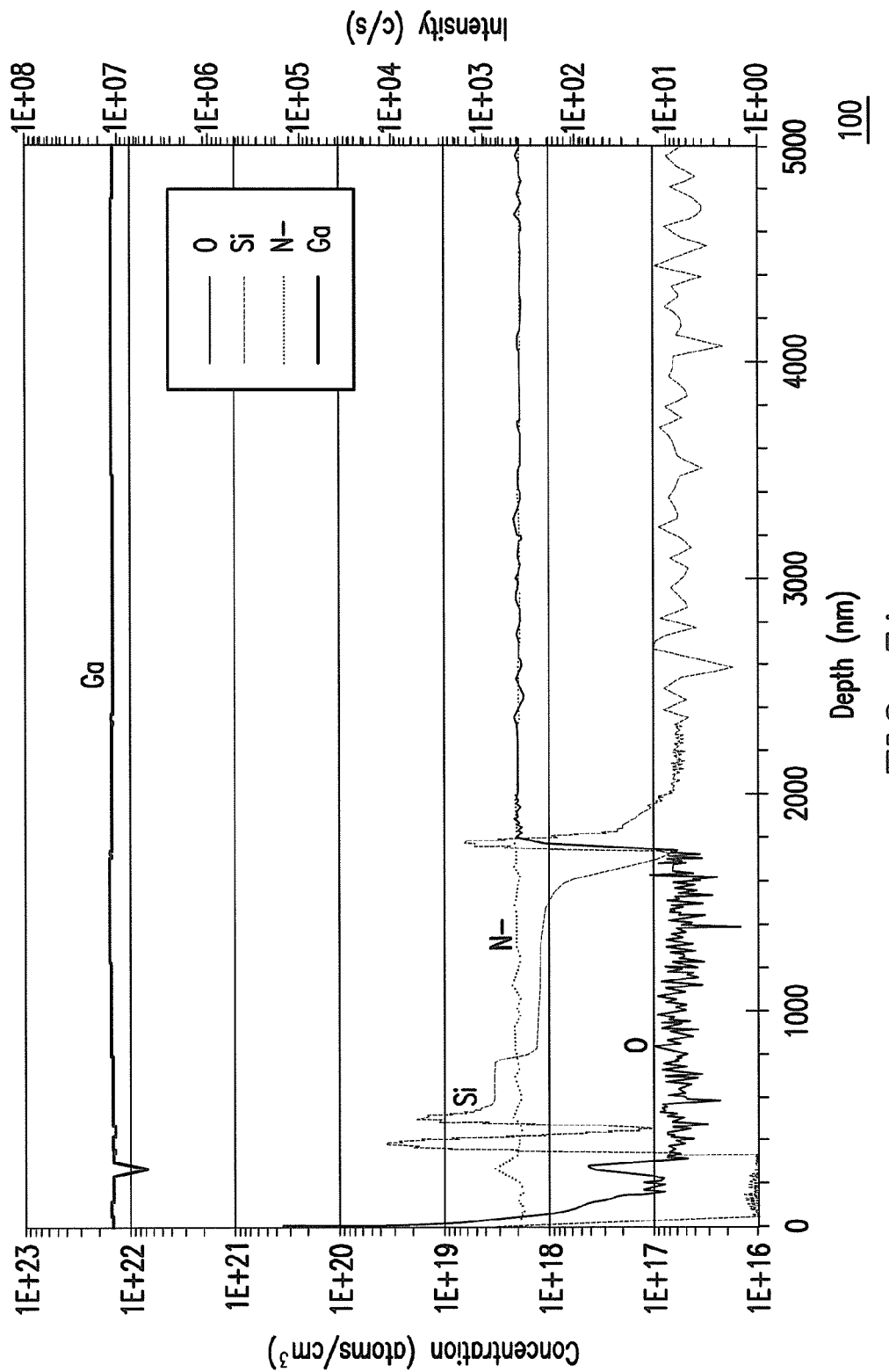
FIG. 3A and FIG. 3B illustrate element analysis of an LED by means of secondary Ion-microprobe mass spectrometry (SIMS) respectively as a comparison example and an exemplary example according to an exemplary embodiment.
Figure 3B:
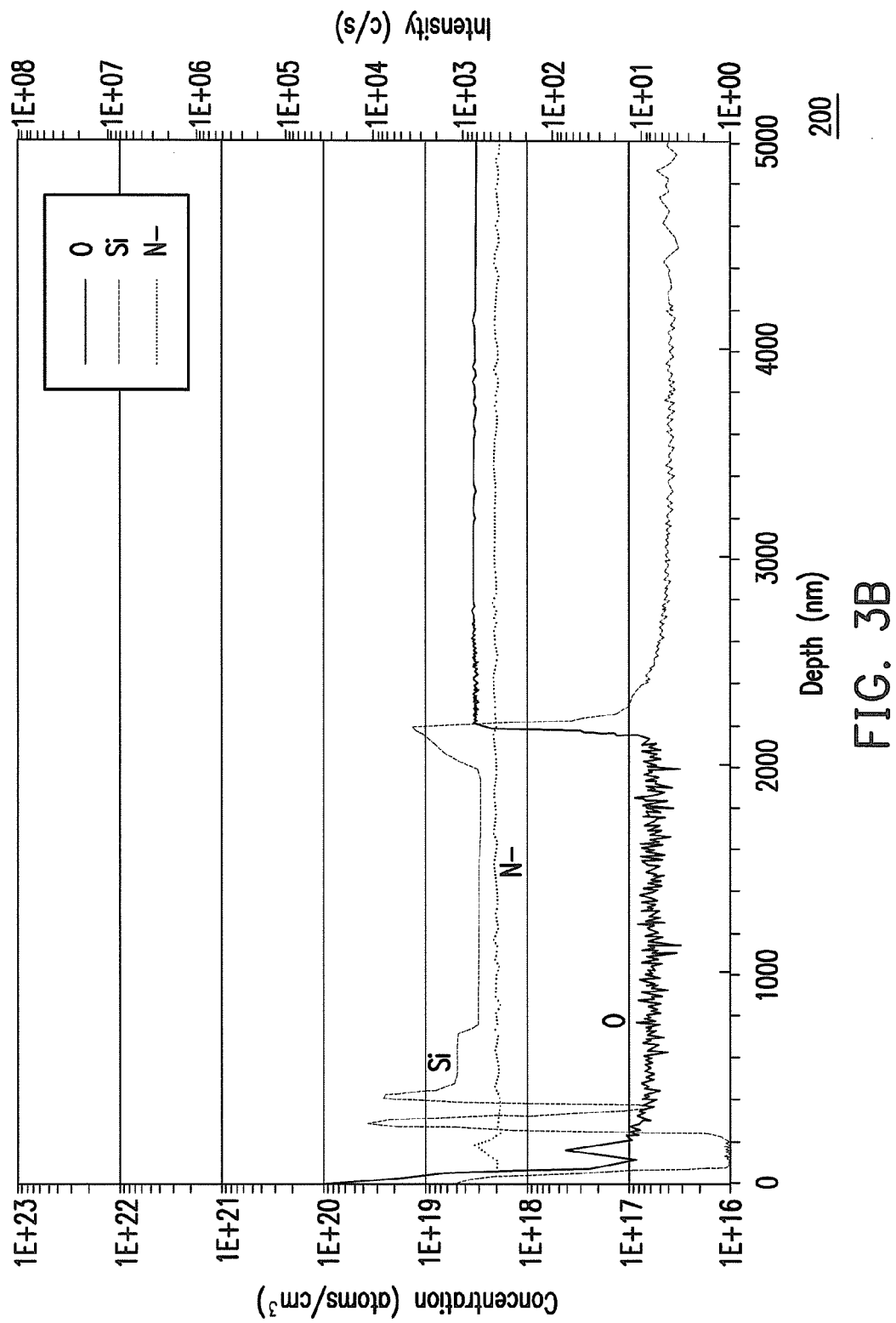
Figure 4:
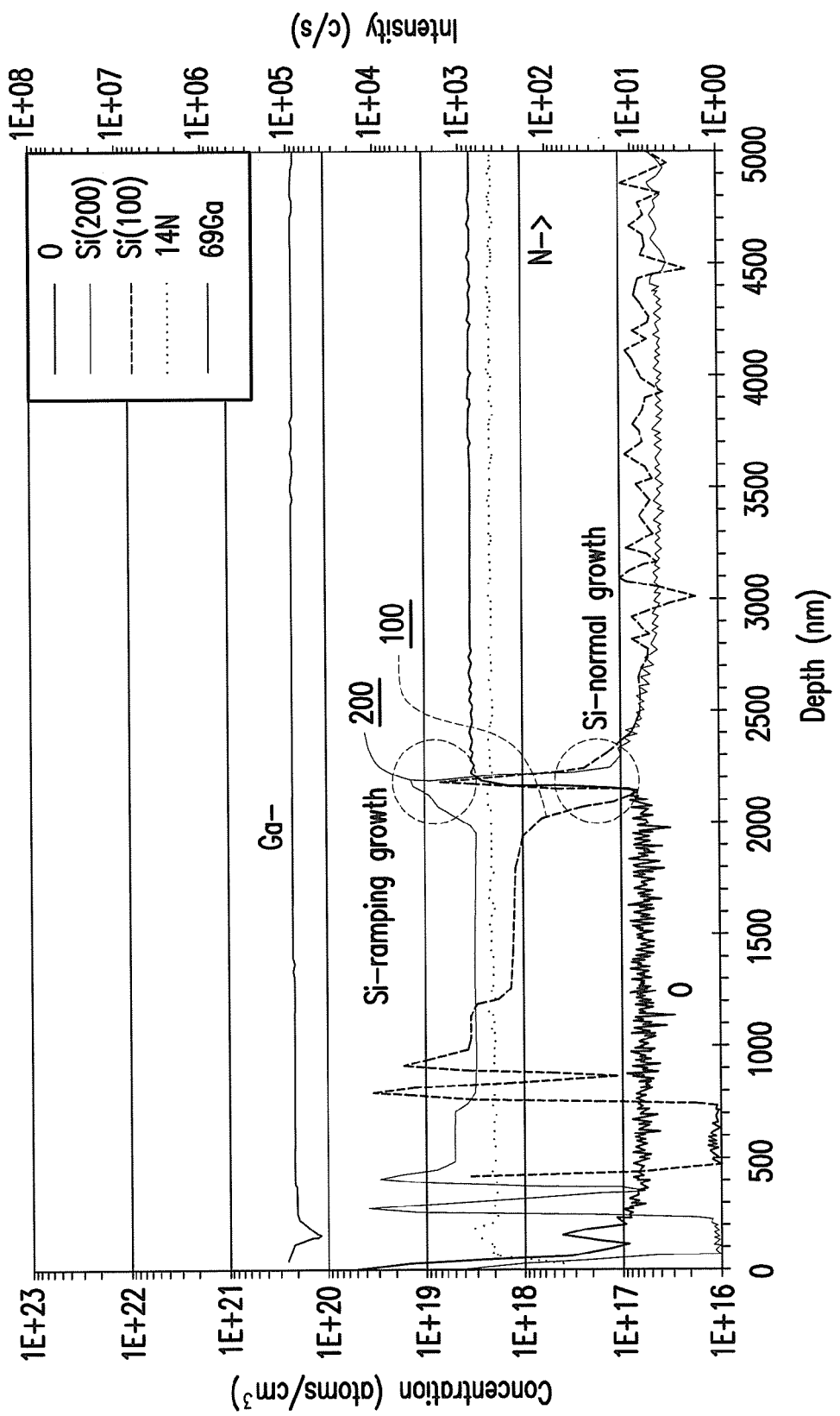
FIG. 4 illustrates comparison results of FIG. 3A and FIG. 3B.

FIG. 3A and FIG. 3B illustrate element analysis of an LED by means of secondary Ion-microprobe mass spectrometry (SIMS) according to an exemplary embodiment. FIG. 4 illustrates comparison results of FIG. 3A and FIG. 3B.

With reference to FIG. 3A, in the LED 100 provided in the comparison example, no interface layer of silicon-doped concentration 222 is grown between the oxide doped semiconductor layer 218 of the n-type doped GaN substrate 210 and the silicon doped semiconductor layer 224 of the n-type semiconductor layer 220. That is, as shown in FIG. 3A, the silicon doped semiconductor layer 224 having the silicon doped element with the fixed concentration is directly grown on the oxide doped semiconductor layer 218 of the n-type doped GaN substrate 210 having the oxide doped element with the fixed concentration, and no interface layer of silicon-doped concentration 222 is grown.

During the high-temperature epitaxial growth of the oxide doped semiconductor layer 218 of the n-type doped GaN substrate 210, the oxygen atoms are diffused because of the high-temperature environment, and the diffused oxygen atoms block the effects of the n-type conductive layer generated by replacing gallium atoms with silicon atoms (resulting from the silicon dopant). As clearly shown in FIG. 3A, when the silicon doped semiconductor layer 224 having the silicon doped element with the fixed concentration is directly grown on the oxide doped semiconductor layer 218, the diffused oxygen atoms leads to the low doped concentration of the silicon and oxide doped elements at the interface (with certain thickness, located around the depth of "1800 nm" defined by the horizontal axis in FIG. 3A) between the n-type doped GaN substrate 210 and the n-type semiconductor layer 220. As long as electrons are injected into the LED 100, the electrons are blocked by the interface having the GaN with high resistance; as a result, the series resistance of the entire device is increased, and the forward voltage of the LED 100 is raised. For instance, if the size of the device is 600×600 um$^2$, and the operating current is 120 mA, the measured forward voltage of the LED 100 is 4.3V.

With reference to FIG. 3B and FIG. 4, in the LED 200 described in the present exemplary embodiment, the interface layer of silicon-doped concentration 222 is grown between the oxide doped semiconductor layer 218 of the n-type doped GaN substrate 210 and the silicon doped semiconductor layer 224 of the n-type semiconductor layer 220, such that the doped concentration of the silicon doped element in the interface layer of silicon-doped concentration 222 is greater than the oxide concentration of the oxide doped semiconductor layer 218, so as to compensate the oxygen atoms and prevent the oxygen atoms from diffusing to the subsequently-grown silicon doped semiconductor layer 224. Thereby, the issue of the raised forward voltage caused by the low doped concentration of the silicon doped element at the interface may be successfully resolved.

Specifically, in an exemplary embodiment, when the doped concentration of the silicon doped element in the silicon doped semiconductor layer 224 of the n-type semiconductor layer 220 reaches $3\times10^{18}$/cm$^3$, the doped concentration of the silicon doped element in the interface layer of silicon-doped concentration 222 is increased by 4.48 times to reach $1.3\times10^{19}$/cm$^3$ (around the depth of "2100 nm" defined by the horizontal axis in FIG. 4) and is then gradually reduced to the doped concentration ($3\times10^{18}$/cm$^3$, around the depth of "2000 nm" defined by the horizontal axis in FIG. 4) of the silicon doped element in the silicon doped semiconductor layer 224, so as to form a interface layer of silicon-doped concentration 222 having the linearly-decreased doped concentration of the silicon doped element. If the measurement conditions here are the same as those depicted in FIG. 3A, the measured forward voltage of the LED 200 is substantially reduced to 3.6V, thus effectively resolving the issue of the raised forward voltage caused by the low doped concentration of the silicon doped element at the interface.

Figure 5A:
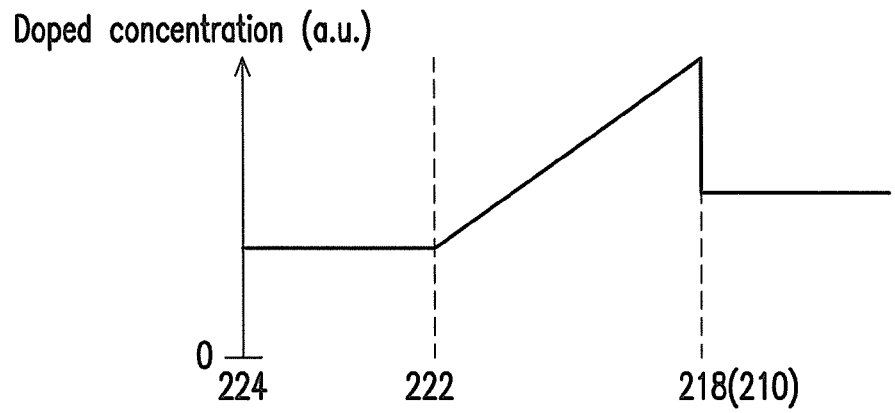
FIG. 5A to FIG. 5C respectively illustrate variations in a doped concentration of an interface layer of silicon-doped concentration in an LED according to an exemplary embodiment.
Figure 5B:
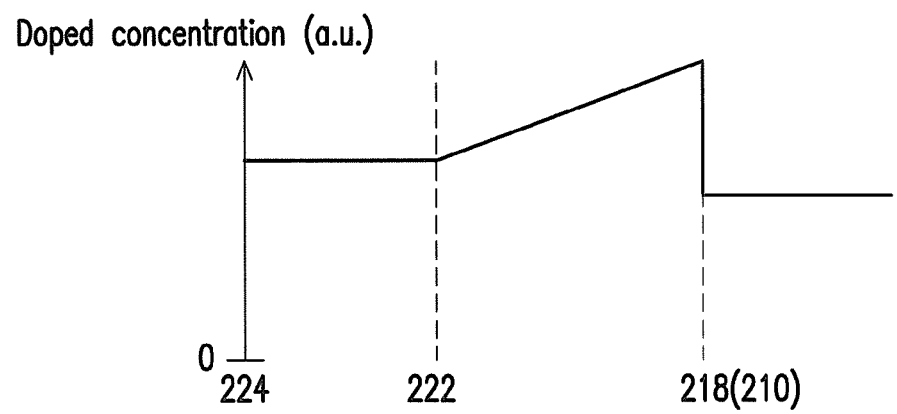
Figure 5C:
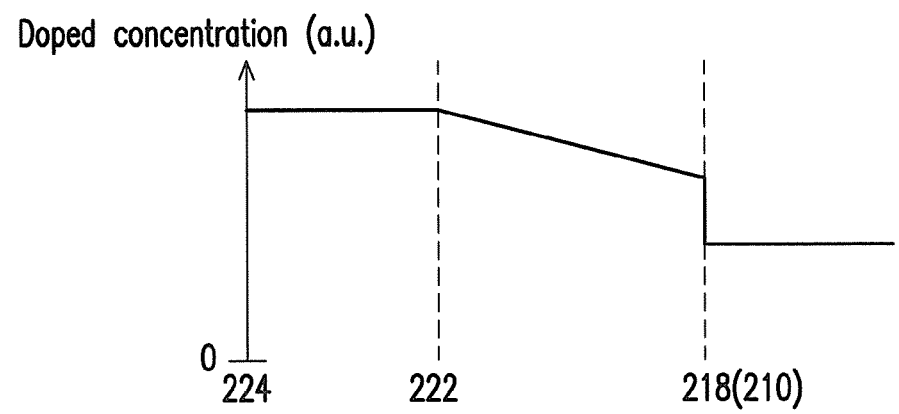

Note that the linear decrease mentioned above should not be construed as a limitation to the disclosure, and people skilled in the art are above to make proper modifications according to the doped concentration of the n-type semiconductor layer. In other exemplary embodiments, the doped concentration of the silicon doped element in the interface layer of silicon-doped concentration 222 may be linearly increased or linearly decreased, as shown in FIG. 5A to FIG. 5C, which should not be construed as a limitation to the disclosure. By setting the peak doped concentration of the silicon doped element in the n-type semiconductor layer 220 at the interface (e.g., in the interface layer of silicon-doped concentration 222) to be from $3\times10^{18}$/cm$^3$ to $1\times10^{20}$/cm, by setting the ratio of the doped concentration of the silicon doped element in the interface layer of silicon-doped concentration 222 to the fixed doped concentration of the oxide doped element in the oxide doped semiconductor layer 218 to be from 0.38 to 1000, or by setting the quotient ($\Delta C/\Delta t$) of the doped concentration variation value ($\Delta C$) of the silicon doped element in the interface layer of silicon-doped concentration 222 with respect to the thickness ($\Delta t$) of the interface to be from $1.0\times10^{22}$/cm$^4$ to $1.0\times10^{26}$/cm$^4$, the issue of the reduced doped concentration at the interface may be effectively resolved. Besides, people skilled in the art are able to perform routine experiments with reference to the previous embodiments and make proper modifications to the interface layer of silicon-doped concentration in the manner depicted in FIG. 3B, and similar effects can still be achieved. Note that the way to change the doped concentration of the silicon doped element in the interface layer of silicon-doped concentration 222 is not limited in the disclosure.

FIG. 6A through FIG. 6E are schematic cross-sectional diagrams illustrating a fabricating process of an LED according to an exemplary embodiment. With reference to FIG. 6A, the n-type doped GaN substrate 210 having an oxide doped semiconductor layer 218 is provided, and a gallium surface (Ga-face) of the oxide doped semiconductor layer 218 serves as the first surface 210A where other devices are to be formed. The second surface 210B, a nitride surface (N-face) of the n-type doped GaN substrate 210, serves as a light emitting surface.

Thereafter, as shown in FIG. 6B, the n-type semiconductor layer 220 including the interface layer of silicon-doped concentration 222 and the silicon doped semiconductor layer 224, the active layer 230, and the p-type semiconductor layer 240 are formed in sequence on the first surface 210A of the n-type doped GaN substrate 210.

Next, with reference to FIG. 6C, a plurality of LEDs 200 depicted in FIG. 1A and FIG. 1B are formed on the first surface 210A (i.e., on the side having the oxide doped semiconductor layer 218) of the n-type doped GaN substrate 210 by performing a chip fabrication process, and each of the LEDs 200 includes the n-type doped GaN substrate 210 having the oxide doped semiconductor layer 218, n-type, the interface layer of silicon-doped concentration 222, the silicon doped semiconductor layer 224, the active layer 230, the p-type semiconductor layer 240, the first electrode 250, and the second electrode 260. A manufacturing technique is applied to reduce the thickness of the n-type doped GaN substrate 210 in the exemplary embodiment, such that a thickness D1 of the n-type doped GaN substrate 210 is reduced to the a thickness D2 according to FIG. 6B and FIG. 6C. Here, the thickness D2 obtained after the n-type doped GaN substrate 210 is reduced is approximately from 70 μm to 200 μm.

Thereafter, as shown in FIG. 6D, the N-face of the n-type doped GaN substrate 210 is etched by applying a wet-etch technique, so as to form the second surface 210B having a plurality of protuberances P on the N-face of the n-type doped GaN substrate 210, and the second surface 210B with the protuberances P has a geometric structure 212 which may be conducive to lessening the total internal reflection effect when light is emitted from the oxide doped GaN interface, thereby further enhancing the light extraction efficiency. The geometric structure 212 (the protuberances P) of the second surface 210B will be described in detail later.

Next, as shown in FIG. 6E, the n-type doped GaN substrate 210 corresponding to the stacked layers of devices is divided to form a plurality of LEDs 200 with high light extraction efficiency. In another exemplary embodiment, the n-type doped GaN substrate 210 may be firstly divided to form the LEDs 200, and then the wet-etch technique is performed on each of the divided substrates 210 so as to reduce the thickness of the n-type doped GaN substrate 210. The process of manufacturing the LED is not limited in the disclosure.

The method for reducing the thickness of the device may be a mechanical polishing method or an etch method, for instance. Accordingly, the reduced thickness of the entire device (excluding the first and second electrodes 250 and 260) in the embodiment is from 70 μm to 200 μm, the absorption of the emitted light from the active layer 230 can be lowered when the light passes through the n-type doped GaN substrate 210, and the light extraction efficiency may be enhanced.

The light extraction and the luminous intensity of the LED 200 can be effectively enhanced by adjusting the geometric structure 212 (the protuberances P) on the second surface 210B of the n-type doped GaN substrate 210. Specifically, in the present exemplary embodiment, a KOH solution with a concentration of 0.9M is used to etch the N-face of the n-type doped GaN substrate 210, and UV light from a mercury lamp is together applied to perform a photoelectrochemical (PEC) process at the etch temperature of 60° C. After the N-face of the n-type doped GaN substrate 210 is etched, the protuberances P (exemplarily shaped as sawtooth pyramids) are formed on the second surface 210B of the n-type doped GaN substrate 210. Those skilled in the art may also select sulfuric acid or other etching solutions to perform the wet-etch process. Moreover, the height and the distribution density of the protuberances P on the second surface 210B can also be controlled by adjusting the type, concentration, and etching time of the selected etching solution. Particularly, when the height and the distribution density of the protuberances P on the second surface 210B of the n-type doped GaN substrate 210 satisfy certain conditions, e.g., if the distribution density of the protuberances P on the second surface 210B is greater than the intrinsic defect density of the n-type doped GaN substrate 210, a total reflection angle of the emitted light from the LED 200 can be effectively eliminated, and the light extraction efficiency can be enhanced.

Figure 7A:
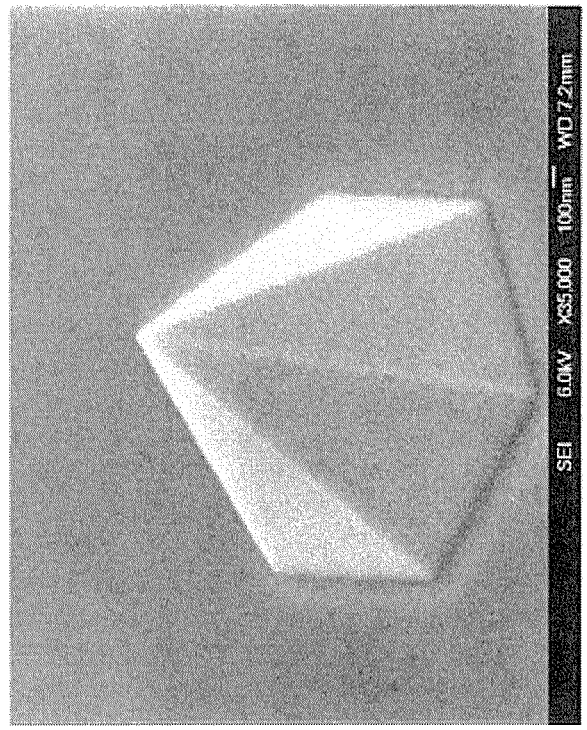
FIG. 7A and FIG. 7B illustrate a pyramid protuberance after a nitride surface (N-face) of a GaN substrate is etched.
Figure 7B:
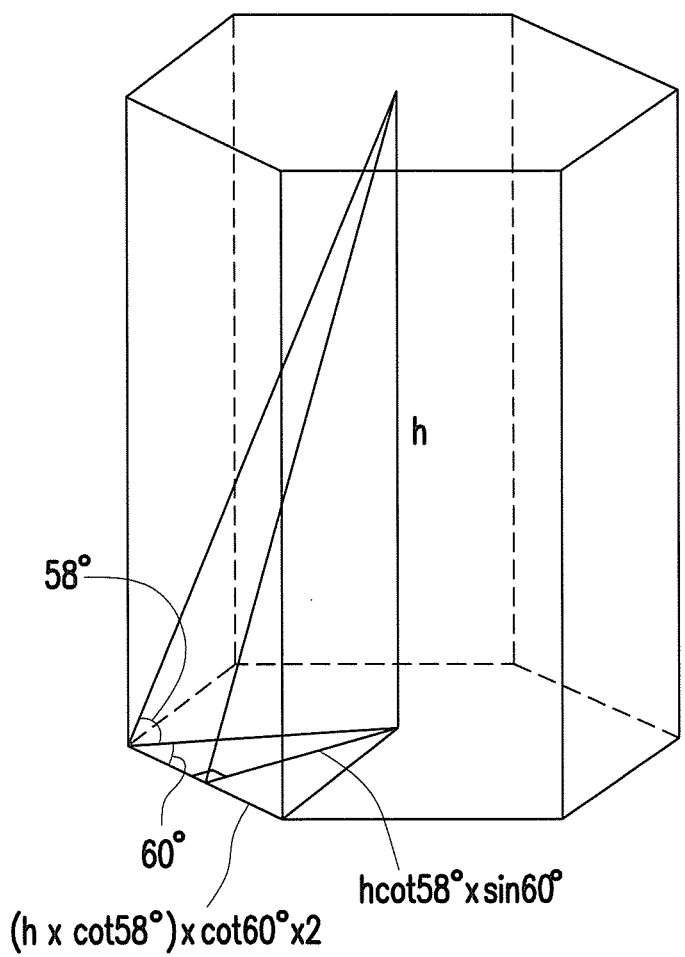

To be specific, please refer to FIGS. 7A and 7B. FIG. 7A illustrates a protuberance P having a pyramidal shape after the N-face of the GaN substrate is etched. According to the lattice arrangement of the GaN substrate, each of the pyramidal protuberances P is shaped as a hexagon, and a characteristic angle of 58 degrees is included between the apex and the bottom surface of each pyramidal protuberance P.

Table 1 lists a plurality of experimental examples of forming the second surface 210B having the geometric structure (the protuberances P) on the n-type doped GaN substrate 210 according to an exemplary embodiment. Moreover, Table 1 exhibits the etch time and the relationship of the vertical heights and the distribution density of the pyramidal protuberances P formed after the etching. The measurement results of the resultant geometric structure 212 obtained through a scanning electron microscope (SEM) in each experimental example are respectively shown in FIG. 8A to FIG. 8E.

TABLE 1

Figure 8C:
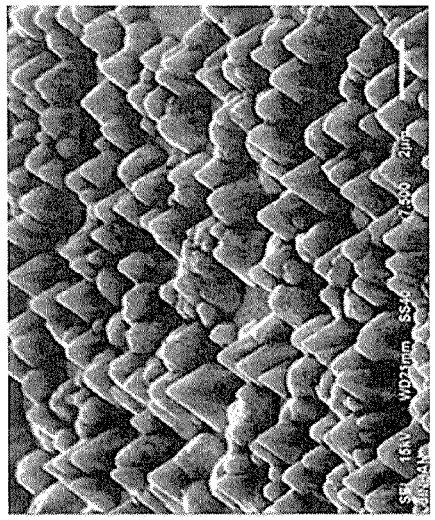
FIG. 8A through FIG. 8E illustrate measurement results obtained through a scanning electron microscope (SEM) after an n-type doped GaN substrate is etched at different etching time according to an exemplary embodiment.
Figure 8B:
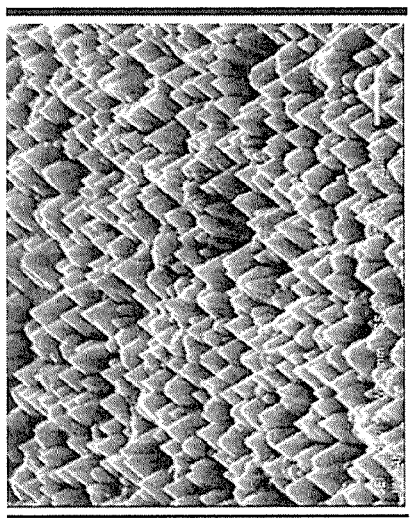
Figure 8A:
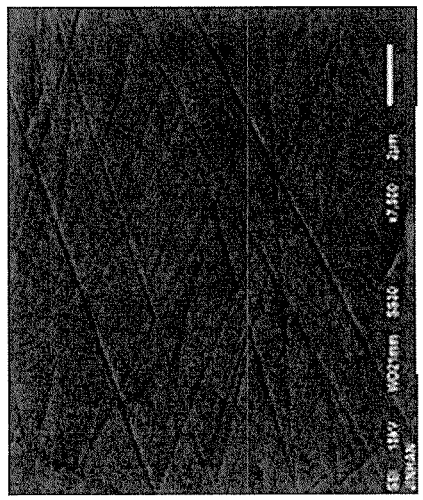
Figure 8E:
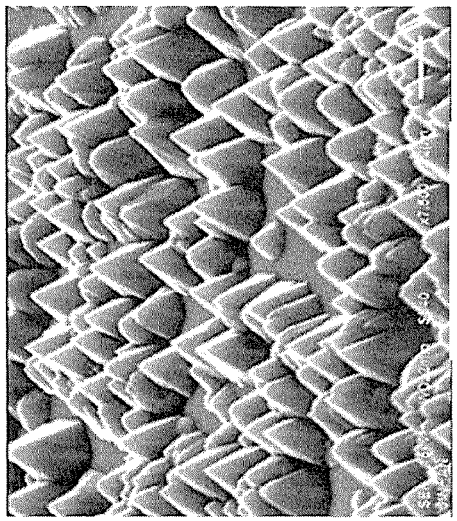
Figure 8D:
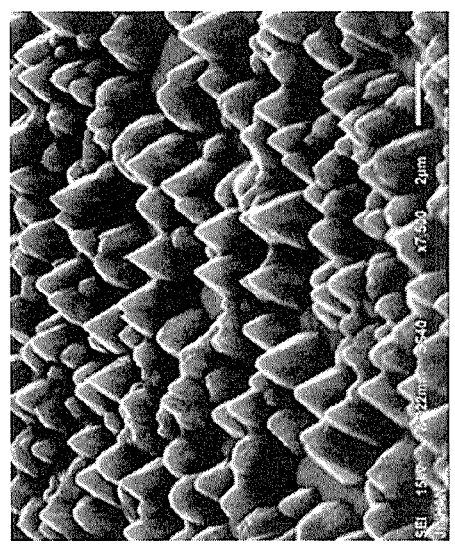

| Experimental Example | Etch Time (Minutes) | Average Vertical Height of Pyramidal Protuberance P (μm) | Average Distribution Density of Pyramidal Protuberance P ($cm^{-2}$) | SEM Photo |
| --- | --- | --- | --- | --- |
| A | Not etched | 0 | 0 | FIG. 8A |
| B | 15 | 1.3 | $1.4 \times 10^8$ | FIG. 8B |
| C | 20 | 1.5 | $7 \times 10^7$ | FIG. 8C |
| D | 25 | 1.6 | $5 \times 10^7$ | FIG. 8D |
| E | 30 | 2.4 | $5 \times 10^7$ | FIG. 8E |

As shown in Table 1 and FIG. 8A to FIG. 8E, the distribution density of the pyramidal protuberances P on the second surface 210B of the n-type doped GaN substrate 210 becomes more sparse as the etch time increases, and the height of the protuberances increases as the etch time increased.

Table 2 shows the positive influence of the etch time on the luminous intensity of the LED 200 when the second surface 210B having different types of geometric structures 212 is formed respectively at different etch time according to an exemplary embodiment of the disclosure, and the etch time is 15 minutes, 20 minutes, 25 minutes, and 30 minutes.

TABLE 2

| Wavelength of Emitted Light from LED 200 | Etch Time (min) | Percentage of Increasing Luminous Intensity (%) |
| --- | --- | --- |
| 450 nm | 0 | 0 |
|  | 15 | 69.2 |
|  | 20 | 57.5 |
|  | 25 | 71.3 |
|  | 30 | 66.7 |

It can be learned from Table 2 that the luminous intensity of the emitted light with the wavelength of 450 nm is increased by 71.3% after the etch process is performed on the second surface 210B (the light emitting surface) of the n-type doped GaN substrate 210 for 25 minutes. Structurally speaking, when the pyramidal protuberance in the geometric structure 212 is from 1.0 μm to 2.5 μm, and the distribution density is from $5 \times 10^7$ to $2 \times 10^8$ $cm^{-2}$, the luminous intensity is increased by at least 50%.

Therefore, in the LED described herein, the second surface 210B satisfying certain conditions may be formed on the oxide doped GaN film, so as to effectively eliminate the total reflection angle of the emitted light from the LED 200 and thereby improve the light extraction efficiency.

Moreover, the LED of the disclosure is not limited to the exemplary embodiments depicted above. The LED may be configured with horizontal electrodes or vertical electrodes, which should not be construed as limitations to the disclosure. For example, the structure of the LED in the disclosure may be that respectively shown in FIG. 9 to FIG. 11.

Figure 9:
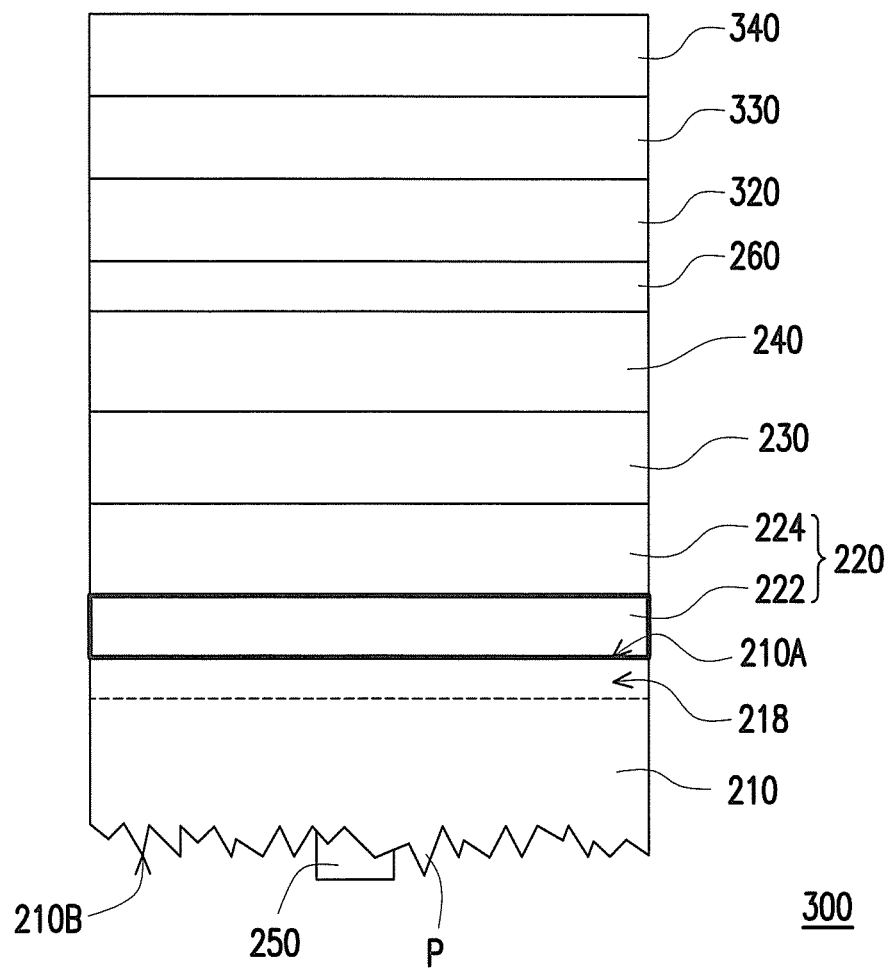
FIG. 9 illustrates the implementation of an LED according to an exemplary embodiment of the disclosure.

FIG. 9 illustrates the implementation of an LED according to an exemplary embodiment of the disclosure. As shown in FIG. 9, the LED 300, from top to bottom, sequentially includes a carrier substrate 340, a bonding layer 330, a reflective layer 320, the second electrode 260, the p-type semiconductor layer 240, the active layer 230, the n-type semiconductor layer 220 including the silicon doped semiconductor layer 224 and the interface layer of silicon-doped concentration 222, the oxide doped semiconductor layer 218, the first-type doped GaN substrate 210, and the first electrode 250. Certainly, the thickness of the first-type doped GaN substrate 210 may be reduced to 10 µm or less. Moreover, in the actual applications, the LED 300 depicted in FIG. 9 is capable of being rotated 180 degrees, so that the carrier substrate 340 is located at the bottom of the LED 300 instead of being on the top of the LED 300. The top-bottom relative positions illustrated here are exemplary, and the disclosure is not limited thereto.

Figure 10:
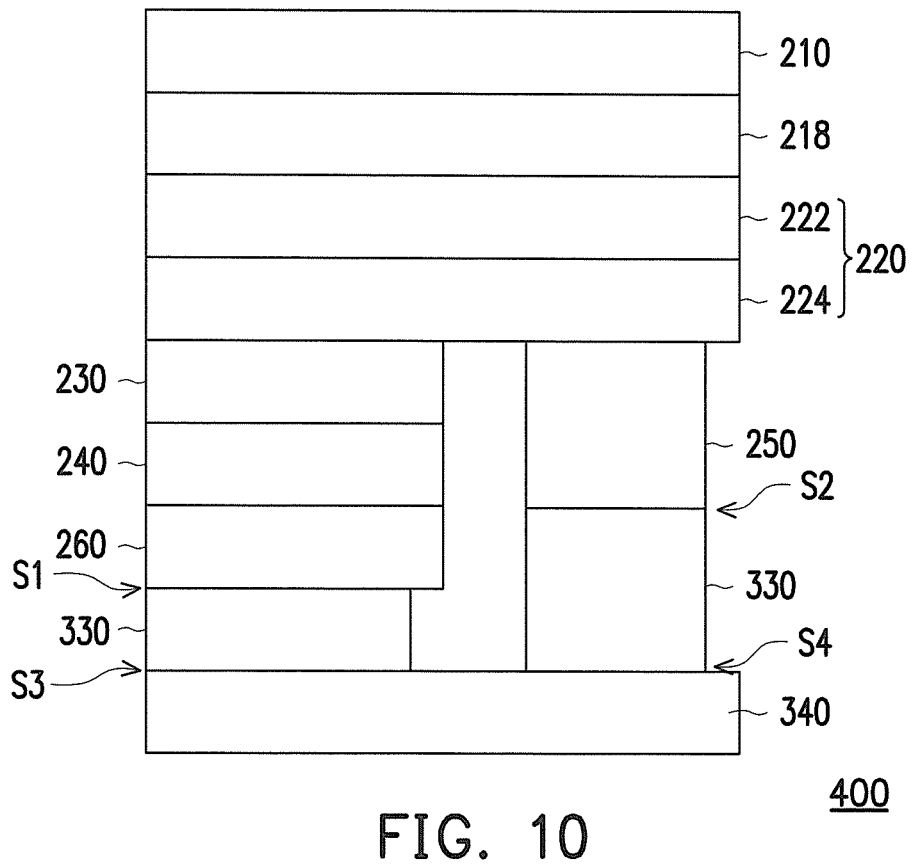
FIG. 10 illustrates the implementation of an LED according to another exemplary embodiment of the disclosure.

FIG. 10 illustrates the implementation of an LED according to another exemplary embodiment of the disclosure. As shown in FIG. 10, the LED 400, from top to bottom, sequentially includes the first-type or n-type doped GaN substrate 210, the oxide doped semiconductor layer 218, the n-type semiconductor layer 220 including the interface layer of silicon-doped concentration 222 and the silicon doped semiconductor layer 224, and the carrier substrate 340, and two stacked layers are sandwiched between the n-type semiconductor layer 220 and the carrier substrate 340. On the left-hand side of FIG. 10, the first stacked layer comprises the active layer 230, the p-type semiconductor layer 240, the second electrode 260, and the bonding layer 330. Furthermore, the second stacked layer located on the right-hand side of the first stacked layer is apart from the first stacked layer by a distance, and the second stacked layer includes the first electrode 250 and the bonding layer 330. Moreover, according to actual device requirements, in the LED 400, a reflective layer may be disposed between the second electrode 260 and the bonding layer 330 of the first stacked layer that is located on the left-hand side of the LED 400 (e.g., at a position S1 where the reflective layer is inserted, as shown in FIG. 10) or may be disposed between the first electrode 250 and the bonding layer 330 of the second stacked layer that is located on the right-hand side of the LED 400 (e.g., at a position S2 where the reflective layer is inserted, as shown in FIG. 10); it is also likely for the reflective layers to be inserted at the above-described positions (i.e., the positions S1 and S2) simultaneously. In addition, the reflective layer may also be located between the carrier substrate 340 and the bonding layer 330 of the first stacked layer that is located on the left-hand side of the LED 400 (e.g., at a position S3 where the reflective layer is inserted, as shown in FIG. 10) and between the carrier substrate 340 and the bonding layer 330 of the second stacked layer that is located on the right-hand side of the LED 400 (e.g., at a position S4 where the reflective layer is inserted, as shown in FIG. 10). As such, the light emitted from the active layer 230 is capable of being reflected to a predetermined path via the reflective layer, and the location of the reflective layer is not limited in the disclosure. In addition, the thickness of the first-type or n-type doped GaN substrate 210 may be reduced to 10 µm or less.

Figure 11:
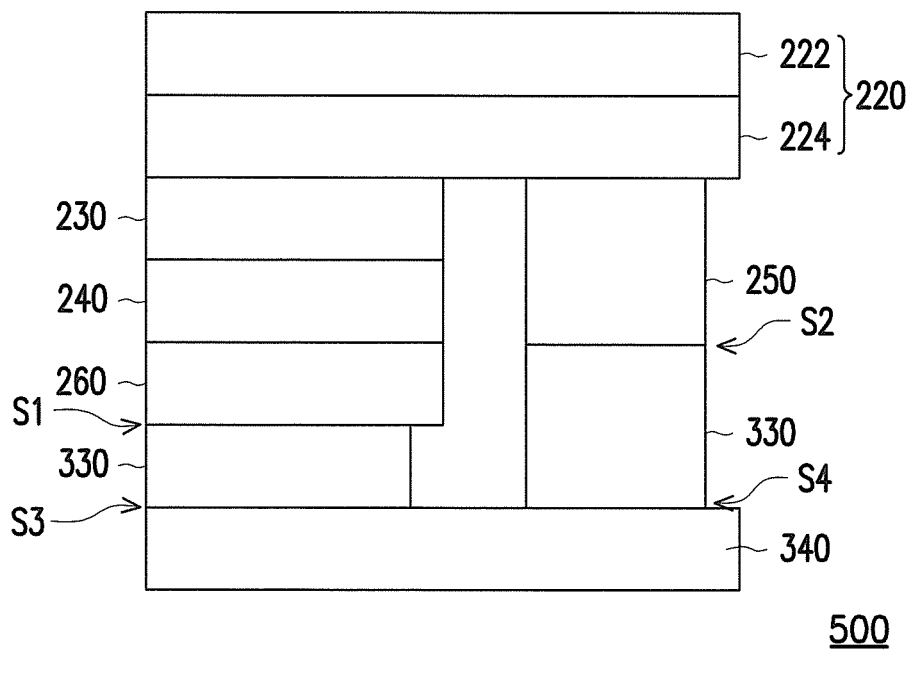
FIG. 11 illustrates the implementation of an LED according to yet another exemplary embodiment of the disclosure.

FIG. 11 illustrates the implementation of an LED according to yet another exemplary embodiment of the disclosure. As shown in FIG. 11, the layer structure of the LED 500 is similar to that depicted in FIG. 10 except that the first-type or n-type doped GaN substrate 210 and the oxide doped semiconductor layer 218 located above the n-type semiconductor layer 220 are omitted in the LED 500 shown in FIG. 11, as compared to the LED 400 depicted in FIG. 10. Furthermore, the same reference numbers are used in the drawings and the description to refer to the same or like parts, and therefore further elaboration is omitted. Similarly, according to the device requirements, in the LED 500, a reflective layer may be disposed between the second electrode 260 and the bonding layer 330 of the first stacked layer that is located on the left-hand side of the LED 500 (e.g., a position S1 where the reflective layer is located, as shown in FIG. 11) or may be disposed between the first electrode 250 and the bonding layer 330 of the second stacked layer that is located on the right-hand side of the LED 500 (e.g., a position S2 where the reflective layer is located, as shown in FIG. 11); it is also likely for the reflective layers to be inserted at the above-described positions (i.e., the positions S1 and S2). In addition, the reflective layer may also be disposed between the carrier substrate 340 and the bonding layer 330 of the first stacked layer that is located on the left-hand side of the LED 500 (e.g., a position S3 where the reflective layer is located, as shown in FIG. 11) and between the carrier substrate 340 and the bonding layer 330 of the second stacked layer that is located on the right-hand side of the LED 500 (e.g., a position S4 where the reflective layer is located, as shown in FIG. 11). As such, the light emitted from the active layer 230 is capable of being reflected to a predetermined path via the reflective layer.

To sum up, the first-type semiconductor layer is homoepitaxially grown on the GaN substrate by having the doped concentration of the doped element in the first-type semiconductor layer satisfy certain conditions, by having the concentration variation of doped element in the first-type semiconductor with respect to the thickness satisfy certain conditions, or by having a quotient of the doped concentration variation value of the doped element in the first-type semiconductor layer satisfy certain conditions. By employing any of the aforesaid techniques, the issue of the reduced concentration at the interface may be effectively resolved, and the performance of the LED may be enhanced. Besides, as described herein, the second surface satisfying certain conditions may be formed on the oxide doped GaN film, so as to effectively eliminate the total reflection angle of the light emitted from the LED and enhance the light extraction efficiency.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light emitting diode comprising:
a first-type doped GaN substrate having a first doped element;
a first-type semiconductor layer disposed on the first-type doped GaN substrate, the first-type semiconductor layer having a second doped element different from the first doped element, wherein a doped concentration of the second doped element has a peak from $3E^{18}/cm^3$ to $1E^{20}/cm^3$ at an interface between the first-type doped GaN substrate and the first-type semiconductor layer;
an active layer located on the first-type semiconductor layer; and
a second-type semiconductor layer located on the active layer, wherein the first type is an N type, the first doped element is an oxide doped element, and the second doped element is a silicon doped element.

2. The light emitting diode as claimed in claim 1, wherein the first-type doped GaN substrate has a first surface and a second surface opposite to each other, the first-type semiconductor layer is located on the first surface, the second surface has a plurality of protuberances, and a distribution density of the protuberances on the second surface is greater than an intrinsic defect density of the first-type doped GaN substrate.

3. The light emitting diode as claimed in claim 1, wherein a thickness of the first-type doped GaN substrate is from 70 µm and to 200 µm.

4. The light emitting diode as claimed in claim 1, further comprising:
a first electrode and a second electrode respectively located on the first-type doped GaN substrate and the second-type semiconductor layer.

5. A light emitting diode comprising:
a first-type doped GaN substrate having a first doped element;
a first-type semiconductor layer disposed on the first-type doped GaN substrate, the first-type semiconductor layer having a second doped element different from the first doped element, and a ratio of a doped concentration of the second doped element to a doped concentration of the first doped element is 0.38 to 1000 at an interface between the first-type doped GaN substrate and the first-type semiconductor layer;
an active layer located on the first-type semiconductor layer;
a second-type semiconductor layer located on the active layer; and
a first electrode and a second electrode respectively located on the first-type doped GaN substrate and the second-type semiconductor layer.

6. The light emitting diode as claimed in claim 5, wherein the ratio of the doped concentration of the second doped element to the doped concentration of the first doped element is 0.38 to 200.

7. The light emitting diode as claimed in claim 5, wherein the ratio of the doped concentration of the second doped element to the doped concentration of the first doped element is 0.38 to 100.

8. The light emitting diode as claimed in claim 5, wherein the doped concentration of the second doped element at the interface has a peak concentration, and the doped concentration of the first doped element is a fixed concentration of the first doped element in the first-type doped GaN substrate.

9. The light emitting diode as claimed in claim 5, wherein the interface is at a location where the doped concentration of the second doped element in the first-type semiconductor layer is changed from a peak concentration to a fixed concentration.

10. The light emitting diode as claimed in claim 5, wherein the first type is an N type, the first doped element is an oxide doped element, and the second doped element is a silicon doped element.

11. The light emitting diode as claimed in claim 5, wherein the first-type doped GaN substrate has a first surface and a second surface opposite to each other, the first-type semiconductor layer is located on the first surface, the second surface has a plurality of protuberances, and a distribution density of the protuberances on the second surface is greater than an intrinsic defect density of the first-type doped GaN substrate.

12. The light emitting diode as claimed in claim 11, wherein a thickness of the first-type doped GaN substrate is from 70 µm to 200 µm.

13. A light emitting diode comprising:
a first-type doped GaN substrate having a first doped element;
a first-type semiconductor layer disposed on the first-type doped GaN substrate, the first-type semiconductor layer having a second doped element different from the first doped element, wherein at an interface between the first-type doped GaN substrate and the first-type semiconductor layer, a quotient of a doped concentration variation value of the second doped element with respect to a thickness of the interface is from $1.0 \times 10^{22}/cm^4$ to $1.0 \times 10^{26}/cm^4$; and
an active layer located on the first-type semiconductor layer;
a second-type semiconductor layer located on the active layer; and
a first electrode and a second electrode respectively located on the first-type doped GaN substrate and the second-type semiconductor layer.

14. The light emitting diode as claimed in claim 13, wherein the quotient of the doped concentration variation value of the second doped element with respect to the thickness is from $3.75 \times 10^{22}/cm^4$ to $5.0 \times 10^{25}/cm^4$.

15. The light emitting diode as claimed in claim 13, wherein the quotient of the doped concentration variation value of the second doped element with respect to the thickness of the interface is from $1.5 \times 10^{23}/cm^4$ to $2.0 \times 10^{25}/cm^4$.

16. The light emitting diode as claimed in claim 13, wherein the thickness of the interface is a thickness between a location of the second doped element having the peak doped concentration and a location of the second doped element having a fixed doped concentration in the first-type semiconductor layer.

17. The light emitting diode as claimed in claim 13, wherein the first type is an N type, the first doped element is an oxide doped element, and the second doped element is a silicon doped element.

18. The light emitting diode as claimed in claim 13, wherein the first-type doped GaN substrate has a first surface and a second surface opposite to each other, the first-type semiconductor layer is located on the first surface, the second surface has a plurality of protuberances, and a distribution density of the protuberances on the second surface is greater than an intrinsic defect density of the first-type doped GaN substrate.

19. The light emitting diode as claimed in claim 13, wherein a thickness of the first-type doped GaN substrate is from 70 µm to 200 µm.

* * * * *